(12) United States Patent
Sugisawa

(10) Patent No.: US 11,003,085 B2
(45) Date of Patent: May 11, 2021

(54) EXTREME ULTRAVIOLET LIGHT GENERATING APPARATUS

(71) Applicant: Gigaphoton Inc., Tochigi (JP)

(72) Inventor: Katsuhiko Sugisawa, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/731,841

(22) Filed: Dec. 31, 2019

(65) Prior Publication Data

US 2020/0133137 A1 Apr. 30, 2020

Related U.S. Application Data

(63) Continuation of application No. PCT/JP2017/030851, filed on Aug. 29, 2017.

(51) Int. Cl.
*G03F 7/00* (2006.01)
*G03F 7/20* (2006.01)
*H05G 2/00* (2006.01)

(52) U.S. Cl.
CPC ......... *G03F 7/70033* (2013.01); *H05G 2/008* (2013.01)

(58) Field of Classification Search
CPC ............. G03F 7/70033; G03F 7/70908; G03F 7/7085; G03F 7/70175; G03F 7/20; H05G 2/008; H05G 2/00
USPC ..................................................... 250/504 R
See application file for complete search history.

(56) References Cited

U.S. PATENT DOCUMENTS

| 7,612,353 | B2* | 11/2009 | Sjmaenok | .............. | B82Y 10/00 |
| | | | | | 156/345.48 |
| 2004/0227102 | A1* | 11/2004 | Kurt | ................. | G01N 21/95684 |
| | | | | | 250/491.1 |
| 2007/0069162 | A1* | 3/2007 | Banine | ................ | G03F 7/70916 |
| | | | | | 250/504 R |
| 2010/0171049 | A1* | 7/2010 | Moriya | .................. | H05G 2/008 |
| | | | | | 250/504 R |

(Continued)

FOREIGN PATENT DOCUMENTS

| JP | 2004-282046 A | 10/2004 |
| JP | 2006-529057 A | 12/2006 |

(Continued)

OTHER PUBLICATIONS

International Search Report issued in PCT/JP2017/030851; dated Dec. 19, 2017.

(Continued)

*Primary Examiner* — Michael Maskell
(74) *Attorney, Agent, or Firm* — Studebaker & Brackett PC

(57) ABSTRACT

In an extreme ultraviolet light generating apparatus, the film thickness of debris adhering to a surface of a component can be measured easily without need of large-scale removal of the component disposed in the chamber. The extreme ultraviolet light generating apparatus includes a chamber in which a droplet made of a target material is irradiated with a laser beam and extreme ultraviolet light is generated, an EUV light collector mirror that is an optical element disposed in the chamber, and a measurement device movable along a surface of the EUV light collector mirror and configured to measure the film thickness of the target material adhering to the surface.

5 Claims, 10 Drawing Sheets

(56) References Cited

U.S. PATENT DOCUMENTS

| | | | |
|---|---|---|---|
| 2011/0048452 A1* | 3/2011 | Zink | B82Y 10/00 134/1 |
| 2017/0238407 A1 | 8/2017 | Nagai et al. | |
| 2017/0299857 A1 | 10/2017 | Kurosawa et al. | |
| 2018/0103534 A1 | 4/2018 | Saito et al. | |

FOREIGN PATENT DOCUMENTS

| | | | |
|---|---|---|---|
| JP | 2007-013054 A | 1/2007 |
| JP | 2009-016640 A | 1/2009 |
| JP | 2009-026933 A | 2/2009 |
| JP | 2009-088439 A | 4/2009 |
| JP | 2011-504294 A | 2/2011 |
| JP | 2011-515650 A | 5/2011 |
| JP | 2014-240949 A | 12/2014 |
| WO | 2009/059614 A1 | 5/2009 |
| WO | 2009/085094 A2 | 7/2009 |
| WO | 2016/098193 A1 | 6/2016 |
| WO | 2016/135965 A1 | 9/2016 |
| WO | 2017/017834 A1 | 2/2017 |

OTHER PUBLICATIONS

International Preliminary Report on Patentability and Written Opinion issued in PCT/JP2017/030851; dated Mar. 3, 2020.

* cited by examiner

EXTREME ULTRAVIOLET LIGHT GENERATING APPARATUS

CROSS-REFERENCE TO RELATED APPLICATIONS

The present application is a continuation application of International Application No. PCT/JP2017/030851 filed on Aug. 29, 2017. The content of the application is incorporated herein by reference in its entirety.

BACKGROUND

1. Technical Field

The present disclosure relates to an extreme ultraviolet light generating apparatus.

2. Related Art

In recent years, along with microfabrication in the semiconductor manufacturing process, fine transfer patterns in photolithography of the semiconductor manufacturing process have been developed rapidly. In the next generation, microfabrication of 20 nm or smaller will be required. Accordingly, it is expected to develop an exposure device in which an extreme ultraviolet (EUV) light generating apparatus that generates extreme ultraviolet (EUV) light having a wavelength of about 13 nm and a reflection reduction projection optical system are combined.

As EUV light generating apparatuses, three types of apparatuses are proposed, namely, a laser produced plasma (LPP) type apparatus that uses plasma generated when a target is irradiated with a laser beam, a discharge produced plasma (DPP) type apparatus that uses plasma generated by discharging, and a synchrotron radiation (SR) type apparatus that uses orbital radiation light.

LIST OF DOCUMENTS

Patent Documents

Patent Document 1: Japanese Unexamined Patent Application Publication No. 2007-013054
Patent Document 2: Japanese Unexamined Patent Application Publication No. 2004-282046
Patent Document 3: International Patent Publication No. 2017/017834
Patent Document 4: International Patent Publication No. 2016/098193
Patent Document 5: International Patent Publication No. 2016/135965

SUMMARY

An extreme ultraviolet light generating apparatus according to a first aspect of the present disclosure may include a chamber, an optical element, and a measurement device. In the chamber, a target material may be irradiated with a laser beam, and extreme ultraviolet light may be generated. The optical element may be disposed in the chamber. The measurement device may be movable along a surface of the optical element, and may be configured to measure the film thickness of a target material adhering to the surface of the optical element.

An extreme ultraviolet light generating apparatus according to a second aspect of the present disclosure may include a chamber, a heat shield, and a measurement device. In the chamber, a target material may be irradiated with a laser beam, and extreme ultraviolet light may be generated. The heat shield may be disposed in the chamber. The measurement device may be movable along a surface of the heat shield, and may be configured to measure the film thickness of a target material adhering to the surface of the heat shield.

An extreme ultraviolet light generating apparatus according to a third aspect of the present disclosure may include a chamber, an exhaust path, and a measurement device. In the chamber, a target material may be irradiated with a laser beam, and extreme ultraviolet light may be generated. Through the exhaust path, exhaust from the inside of the chamber may flow. The measurement device may be movable along an inner surface of the exhaust path, and may be configured to measure the film thickness of a target material adhering to the inner surface of the exhaust path.

BRIEF DESCRIPTION OF THE DRAWINGS

Some embodiments of the present disclosure will be described below as just examples with reference to the accompanying drawings.

DESCRIPTION OF EMBODIMENTS

Figure 1:
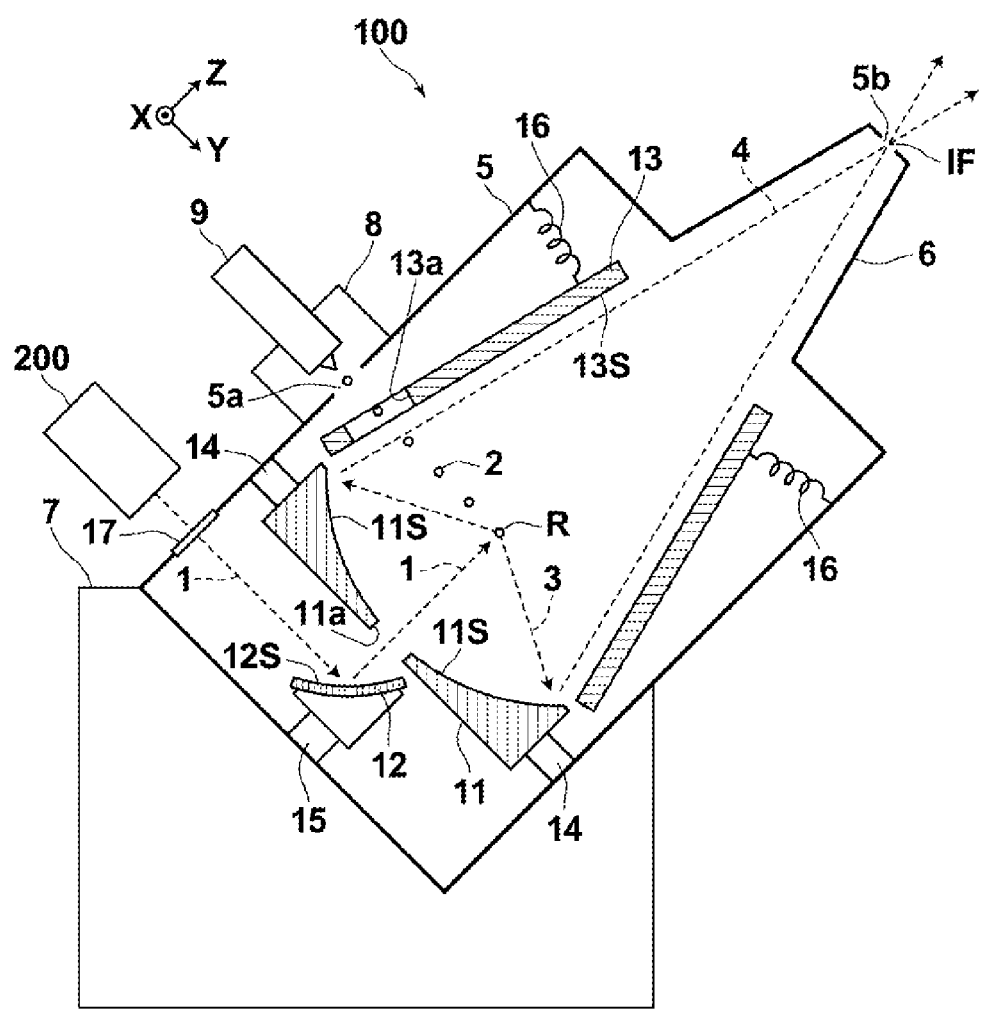
FIG. 1 is a diagram schematically illustrating a configuration of an EUV light generating apparatus according to a comparative example.

<Contents>
1. Terms
2. Problem
2.1 Configuration of comparative example
2.2 Operation of comparative example
2.3 Problem
3. First Embodiment
3.1 Configuration
3.2 Operation 3.3 Effect
4. Second Embodiment
4.1 Configuration
4.2 Operation
4.3 Effect
5. Third Embodiment
5.1 Configuration
5.2 Operation
5.3 Effect
6. Fourth Embodiment
6.1 Configuration
6.2 Operation
6.3 Effect
7. Fifth Embodiment
7.1 Configuration
7.2 Operation
7.3 Effect
8. Others Hereinafter, embodiments of the present disclosure will be described in detail with reference to the drawings. The embodiments described below illustrate some examples of the present disclosure, and do not limit the contents of the present disclosure. All of the configurations and operations described in the embodiments are not always indispensable as the configurations and operations of the present disclosure. It should be noted that the same constituent elements are denoted by the same reference signs, and overlapping description is omitted.

1. Terms

"Fluorescent X-ray unit" represents a unit configured to measure the thickness of a film to be measured by fluorescent X-ray analysis. "Fluorescent X-ray analysis" is a method of analyzing a component element, film thickness, and the like of a measurement target substance on the basis of energy and intensity of a fluorescent X-ray generated when the measurement target subject is irradiated with the X-ray.

2. Problem

With referent to FIG. 1, an extreme ultraviolet light generating apparatus 100 according to a comparative example of the present disclosure will be described. In the below description, extreme ultraviolet light is referred to as EUV light, and an extreme ultraviolet light generating apparatus is referred to as an EUV light generating apparatus. The EUV light generating apparatus 100 of the comparative example is used together with at least one laser apparatus 200.

The EUV light generating apparatus 100 generates plasma of a target material by radiating at least one pulse laser beam 1, emitted from the laser apparatus 200, to a droplet 2 made of the target material. The generated plasma emits radiation light 3. The radiation light 3 includes light having various wavelength, beside the EUV light 4. In this way, the EUV light generating apparatus 100 can generate the EUV light 4.

2.1 Configuration of Comparative Example

FIG. 1 is a diagram schematically illustrating a configuration of the EUV light generating apparatus 100 according to a comparative example. As illustrated, the EUV light generating apparatus 100 includes a chamber 5, a connecting section 6 for taking out the generated EUV light 4 to the outside at a certain position, and a chamber holding member 7 that holds the chamber 5. The EUV light generating apparatus 100 supplies the EUV light 4 as exposure light, to an exposure device applied to optical lithography in the semiconductor manufacturing process, for example. In that case, the connecting section 6 is a part connecting the chamber 5 and the exposure device. Here, it is assumed that an emitting direction of the EUV light 4 is a Z direction, an output direction of the droplet 2 is a Y direction, and a direction perpendicular to both the Z direction and the Y direction is an X direction.

The chamber 5 is a container that forms an internal space isolated from the external environment, and is used for generating the EUV light 4 in the internal space kept is a vacuum state. The chamber 5 is provided with a droplet supply device 9 via a holder 8. The chamber 5 has a through hole 5a. The holder 8 is disposed detachably on the outside of the chamber 5 so as to cover the through hole 5a.

The droplet supply device 9 is a device that allows the target material to melt and outputs it toward a plasma generating region R in the form of a droplet 2. The droplet supply device 9 outputs the droplet 2 by means of a so-called continuous jet method, for example. The material of the droplet 2, that is, the target material, is a metal material. The metal material is a material including tin, terbium, gadolinium, or a combination of any two of them, and is preferably tin.

Inside the chamber 5, an EUV light collector mirror 11, a laser beam condensing mirror 12, and a heat shield 13 are provided. The EUV light collector mirror 11 is held inside the chamber 5 via a holder 14. The laser beam condensing mirror 12 is held inside the chamber 5 via a holder 15. The heat shield 13 is held inside the chamber 5 via a holder 16. The chamber 5 is also provided with a window 17 that transmits the pulse laser beam 1.

The EUV light collector mirror 11 is held so as to collect the radiation light 3 generated in the plasma generating region R and reflect it to the side of the connecting section 6. As described above, the radiation light 3 includes the EUV light 4. The EUV light collector mirror 11 has the through hole 11a formed in a center portion thereof. The through hole 11a is a hole for transmitting the pulse laser beam 1, reflected by the laser beam condensing mirror 12, toward the plasma generating region R.

The EUV light collector mirror 11 selectively reflects the EUV light 4, among the various types of light included in the radiation light 3, to condense it on an intermediate focal point IF. The reflective surface of the EUV light collector mirror 11 is formed of a multilayer reflective film in which molybdenum and silicon are alternately layered, for example. The reflective surface of the EUV light collector mirror 11 is formed of a part of a spheroidal face having a first focal point and a second focal point, for example. The EUV light collector mirror 11 is disposed such that the first focal point is positioned in the plasma generating region R and the second focal point is positioned at the intermediate focal point IF.

The laser beam condensing mirror 12 is formed of an off-axis parabolic mirror, for example. The laser beam condensing mirror 12 is held such a state that the focal point thereof is positioned in the plasma generating region R. The laser beam condensing mirror 12 condenses the pulse laser beam 1 having passed through the window 17 in the plasma generating region R.

The heat shield 13 is a member that absorbs radiant light secondarily generated along with generation of the plasma. The heat shield 13 has a tapered cylindrical shape in which an end portion on the −Z direction has a large diameter and an end portion in the +Z direction has a small diameter. The heat shield 13 is disposed to surround the plasma generating region R. Also, the heat shield 13 is disposed to surround the optical path of the radiation light 3 reflected by the EUV light collector mirror 11. The end portion in the −Z direction of the heat shield 13 is positioned in the vicinity of the outer periphery of the EUV light collector mirror 11. The heat shield 13 has a through-hole 13a for transmitting the droplet 2.

2.2 Operation of Comparative Example

The droplet supply device 9 heats the target material stored in the tank, for example, with a heater, not illustrated, to melt it. In the case where the target material is tin, since the melting point of tin is 232° C., the tank is heated to a temperature of 250° C. or higher but 290° C. or lower. The droplet supply device 9 oscillates a piezoelectric element not illustrated mounted on a nozzle, for example, to divide the melted target material in a predetermined cycle to form the droplet 2, and outputs the droplet 2 from the nozzle with a predetermined frequency. The droplets 2 output into the chamber 5 are sequentially supplied to the plasma generating region R.

On the other hand, the pulse laser beam 1 emitted from the laser apparatus 200 and having passed through the window 17 is reflected by the laser beam condensing mirror 12 and is condensed in the plasma generating region R. At this time, the emission timing of the pulse laser beam 1 is defined such that the timing that the droplet 2 reaches the plasma generating region R and the timing that the pulse laser beam 1 reaches the plasma generating region R coincide with each other, on the basis of the detection result of a droplet detection sensor not illustrated.

The pulse laser beam 1 condensed in the plasma generating region R is radiated to the droplet 2 supplied to the plasma generating region R. The droplet 2 is made into plasma when being irradiated with the pulse laser beam 1. At that time, the droplet 2 emits the radiation light 3. The EUV light 4 included in the radiation light 3 is selectively reflected by the EUV light collector mirror 11, and is condensed at the intermediate focal point IF of the connecting section 6. The EUV light 4 condensed on the intermediate focal point IF passes through the through-hole 5b of the chamber 5 and is emitted toward the exposure device not illustrated. The radiant light secondarily generated along with generation of the plasma is absorbed by the EUV light collector mirror 11 and the heat shield 13.

2.3 Problem

When the pulse laser beam 1 is radiated to the droplet 2, debris of the target material is secondarily generated. Hereinafter, description will be continued on the premise that the target material is tin, for example. The tin debris generated as described above may adhere to the surfaces of components in the chamber 5, that is, on a surface 11S of the EUV light collector mirror 11, a surface 13S of the heat shield 13, a surface 12S of the laser beam condensing mirror 12, and the like.

The tin debris adhering to the surface of a component in the chamber 5 gradually degrades the performance originally held by the component. The component in such a state must be replaced with a new component finally. Therefore, it is required to measure the adhering amount of the tin debris on the surface of each component, more specifically, a film thickness of the tin debris, to know an appropriate time to replace the component. However, in a conventional EUV light generating apparatus, it is necessary to remove the components such as the EUV light collector mirror 11, the heat shield 13, and the like from the chamber 5 under a condition that driving of the apparatus is completely stopped, and to measure the film thickness outside the apparatus. In view of the above, a technique that enables easy measurement of the film thickness of the debris adhering to the surface of a component, without need of large-scale removal of the component, is required.

3. First Embodiment

With reference to FIGS. 2 to 6, an EUV light generating apparatus 10 according to a first embodiment will be described. The EUV light generating apparatus 10 has a function of measuring the film thickness of debris adhering to the surface of a component in the chamber 5 without need of removing the component. Note that regarding the configurations and operations of the EUV light generating apparatus 10 of the first embodiment, description is omitted for the configurations and operations that are the same as those of the EUV light generating apparatus 100 of the comparative example illustrated in FIG. 1.

3.1 Configuration

Figure 2:
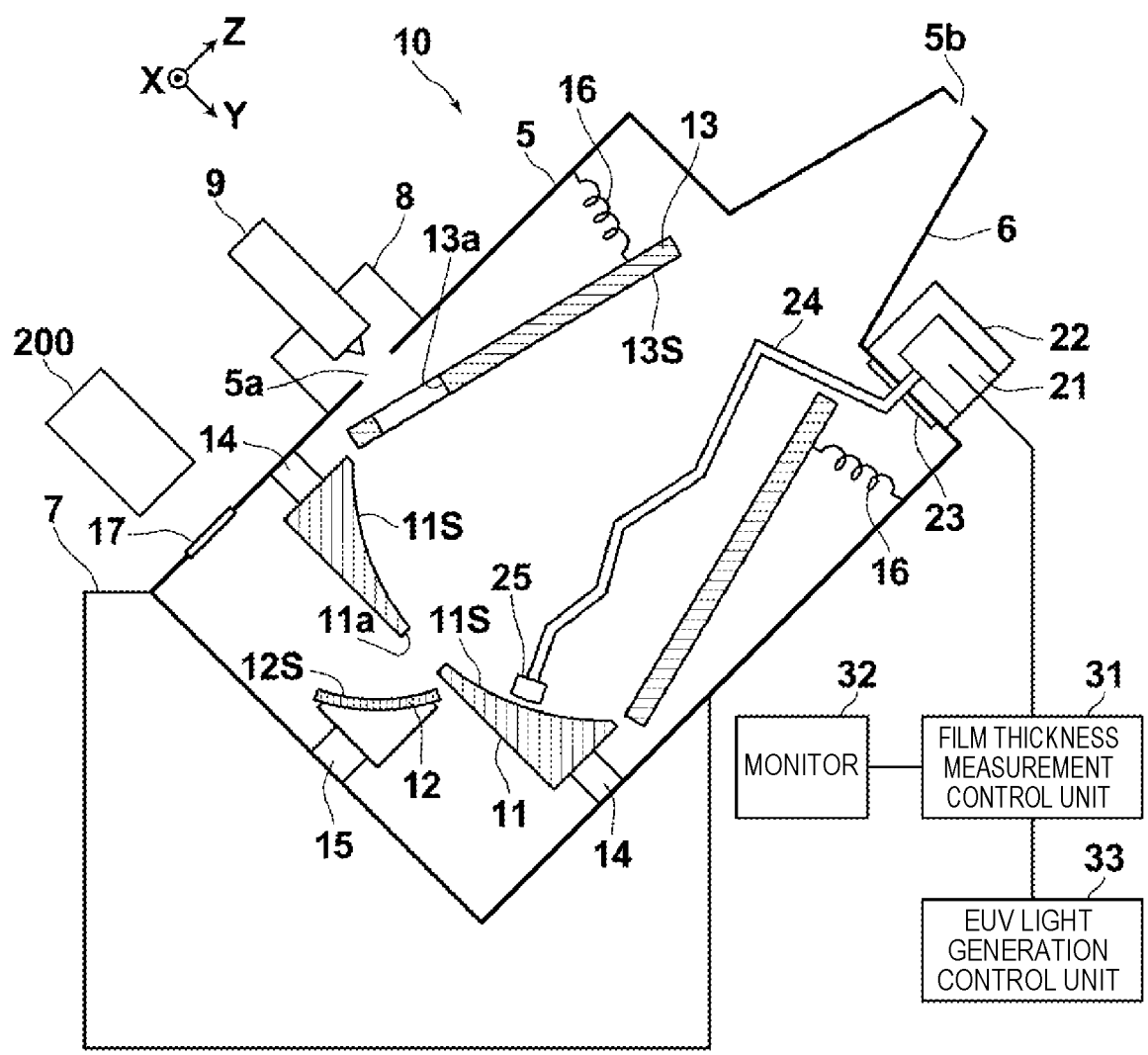
FIG. 2 is a diagram schematically illustrating a configuration of an EUV light generating apparatus according to a first embodiment.

FIG. 2 schematically illustrates a configuration of the EUV light generating apparatus 10 according to the first embodiment. As illustrated, the EUV light generating apparatus 10 includes a robot hand drive unit 21, a storage box 22 for storing the robot hand drive unit 21, a gate 23 for opening and closing the storage box 22, a polyarticular robot hand 24, and a fluorescent X-ray unit 25. The EUV light generating apparatus 10 further includes a film thickness measurement control unit 31 connected with the robot hand drive unit 21, a monitor 32 connected with the film thickness measurement control unit 31, and an EUV light generation control unit 33 connected with the film thickness measurement control unit 31. The robot hand drive unit 21, the robot hand 24, and the fluorescent X-ray unit 25 constitute a measurement device according to the present disclosure. The monitor 32 constitutes a display unit according to the present disclosure.

Figure 3:
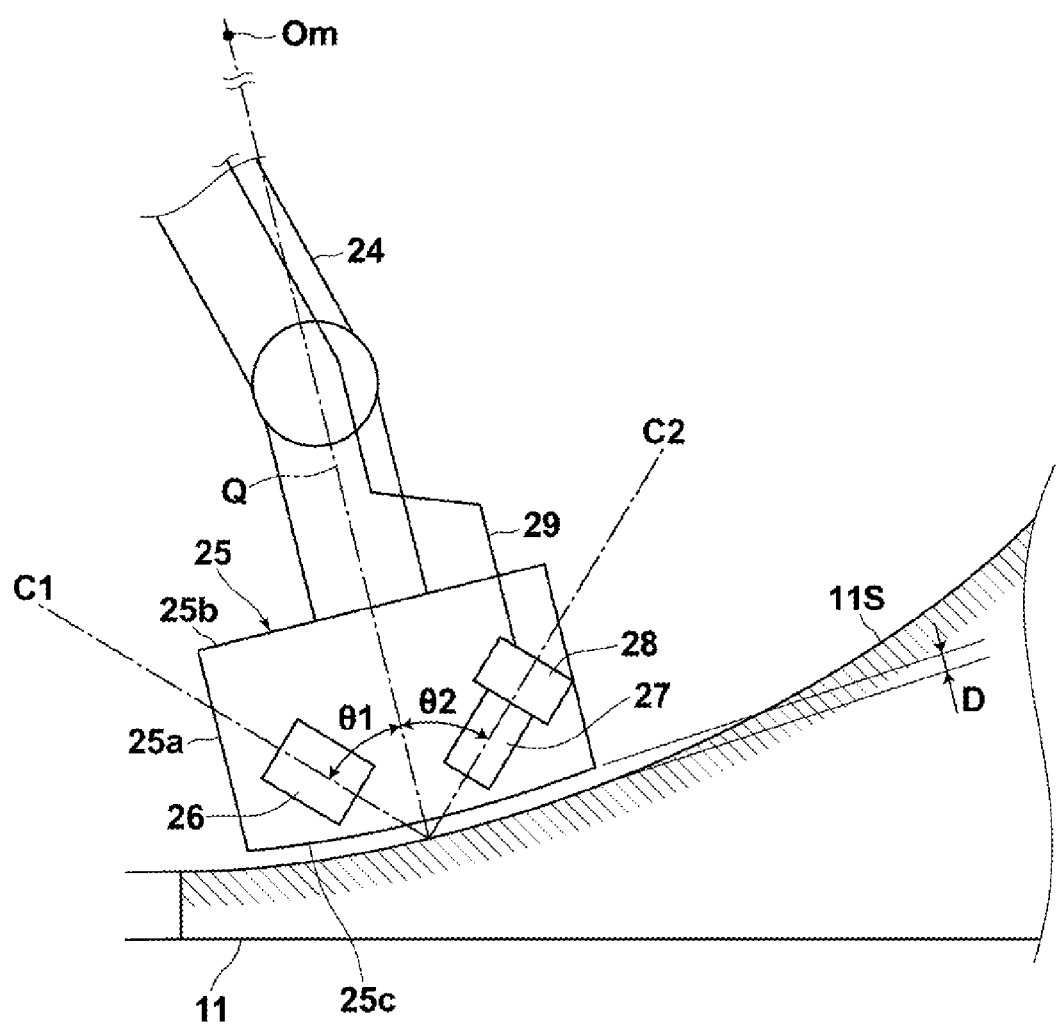
FIG. 3 is a diagram illustrating a schematic side face shape of a fluorescent X-ray unit used in the EUV light generating apparatus illustrated in FIG. 2.

The fluorescent X-ray unit 25 measures the film thickness of a measurement target object by the fluorescent X-ray analysis. That is, as illustrated in FIG. 3, the fluorescent X-ray unit 25 includes a primary X-ray tube 26 that emits a primary X-ray, an X-ray optical member 27, and a fluorescent X-ray detector 28. When a measurement target object is irradiated with a primary X-ray emitted from the primary X-ray tube 26, a fluorescent X-ray having an energy spectrum unique to the component element is emitted from the object. The fluorescent X-ray enters the fluorescent X-ray detector 28 via the X-ray optical member 27 having a spectroscopic function. The fluorescent X-ray detector 28 detects the intensity of the incident fluorescent X-ray and outputs an intensity detection signal. The intensity detection signal is input to the film thickness measurement control unit 31 illustrated in FIG. 2 via a signal line 29. The intensity of the fluorescent X-ray is in proportion to the thickness of the measurement target object. Therefore, the intensity detection signal input to the film thickness measurement control unit 31 represents the thickness of the measurement target object.

The fluorescent X-ray unit 25 is held by a tip portion of the robot hand 24. The robot hand 24 is driven by the robot hand drive unit 21, and the robot hand 24 moves the fluorescent X-ray unit 25 in three dimensions along the surface 11S that is a reflective surface of the EUV light collector mirror 11. When the fluorescent X-ray unit 25 moves as described above, it is maintained in a state of approaching the surface 11S in a confronting manner. Operation of the robot hand drive unit 21 is controlled by the film thickness measurement control unit 31 formed of a personal computer (PC) or the like, for example. The control operation of the film thickness measurement control unit 31 is controlled by the EUV light generation control unit 33 that controls the overall operation of the EUV light generating apparatus 10.

Figure 5:
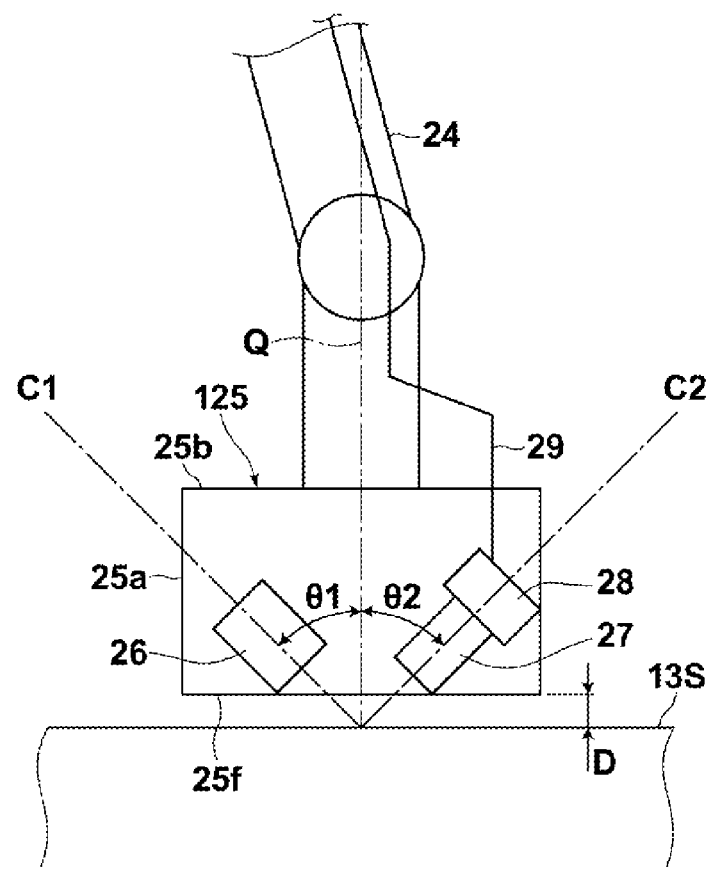
FIG. 5 is a diagram illustrating a schematic side face shape of another fluorescent X-ray unit used in an EUV light generating apparatus according to the present disclosure.

Here, as illustrated in FIG. 3, consideration will be given on a primary X-ray incident axis C1 from the primary X-ray tube 26, a fluorescent X-ray detection axis toward the fluorescent X-ray detector 28, that is, an optical axis C2 of the X-ray optical member 27, and a normal line Q standing at the primary X-ray incident point on the surface 11S of the EUV light collector mirror 11. "Confronting" of the fluorescent X-ray unit 25 described above means a state where an angle θ1 defined by the primary X-ray incident axis C1 against the normal line Q and an angle θ2 defined by the fluorescent X-ray detection axis C2 against the normal line Q are equal to each other. This point is the same even in the case where the surface 13S along which the fluorescent X-ray unit 25 moves is flat and a measurement surface 25f of the fluorescent X-ray unit 25 is flat accordingly, as illustrated in FIG. 5.

Further, "approach" of the fluorescent X-ray unit 25 described above generally means a distance D between the surface of the fluorescent X-ray unit 25 confronting the surface 11S of the EUV light collector mirror 11, that is, a measurement surface 25c, and the surface 11S is about 5 mm or less.

Figure 4:
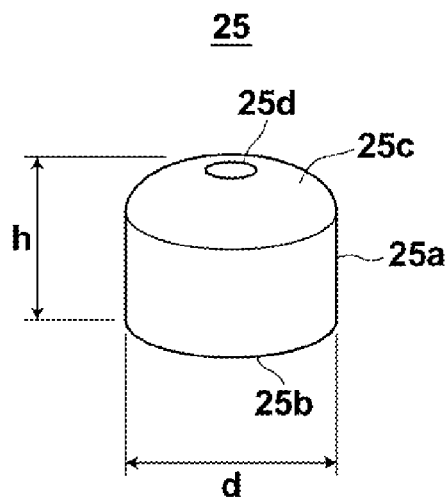
FIG. 4 is a diagram illustrating an overall perspective shape of the fluorescent X-ray unit illustrated in FIG. 3.

Here, the overall shape of the fluorescent X-ray unit 25 including the shape of the measurement surface 25c will be described. FIG. 4 illustrates an overall perspective shape of the fluorescent X-ray unit 25. The fluorescent X-ray unit 25 includes a side surface 25a in a cylindrical shape, a rear end surface 25b, and the measurement surface 25c that is a curved surface. The measurement surface 25c has a through-hole 25d for transmitting the primary X-ray and the fluorescent X-ray. The radius of curvature of the measurement surface 25c is set to be slightly smaller than the radius of curvature of the surface 11S of the EUV light collector mirror 11. Further, as illustrated in FIG. 3, the fluorescent X-ray unit 25 is disposed such that the center of the curved surface constituting the measurement surface 25c and the center of the surface 11S of the EUV light collector mirror 11 coincide with each other at a common point Om.

The gate 23 illustrated in FIG. 2 is movable in the ±X direction, for example, and opens and closes the opening of the storage box 22. In order to measure the film thickness of the tin debris, when the fluorescent X-ray unit 25 is moved along the surface 11S of the EUV light collector mirror 11, the opening is opened, and the robot hand 24 is extended into the chamber 5 through the opening. When measurement of the film thickness of the tin debris is not performed, the robot hand 24 is folded and is stored in the storage box 22 together with the fluorescent X-ray unit 25, and the opening of the storage box 22 is closed by the gate 23. Thereby, the robot hand 24 and the fluorescent X-ray unit 25, not in use, are protected.

3.2 Operation

The fluorescent X-ray unit 25 moves along the surface 11S of the EUV light collector mirror 11 by the robot hand 24. Each time the fluorescent X-ray unit 25 moving in this manner becomes a state where it approaches, in a confronting manner, each of the points on the surface 11S, measurement of the film thickness of the tin debris on the surface 11S is performed. Measurement of the film thickness is performed by radiating the primary X-ray emitted from the primary X-ray tube 26 illustrated in FIG. 3 to the measurement point on the surface 11S, as described above, and detecting the intensity of the fluorescent X-ray emitted at that time by the fluorescent X-ray detector 28. The intensity detection signal output by the fluorescent X-ray detector 28 is input to the film thickness measurement control unit 31 illustrated in FIG. 2 via the signal line 29. As the fluorescent X-ray detector 28, a silicon drift detector is used preferably, for example.

Note that when measurement of the film thickness of the tin debris is performed, generation of EUV light is temporarily stopped. That is, supply of the droplet 2 by the droplet supply device 9 and supply of the pulse laser beam 1 from the laser apparatus 200 are temporarily stopped. The timing of performing measurement of the film thickness is determined, by the EUV light generation control unit 33 illustrated in FIG. 2, to the time when the number of accumulated shots (the number of supply) of the droplets 2, the accumulated generation time of the EUV light 4, the accumulated energy amount of the generated EUV light 4, or the like reaches a predetermined upper limit value.

Figure 6:
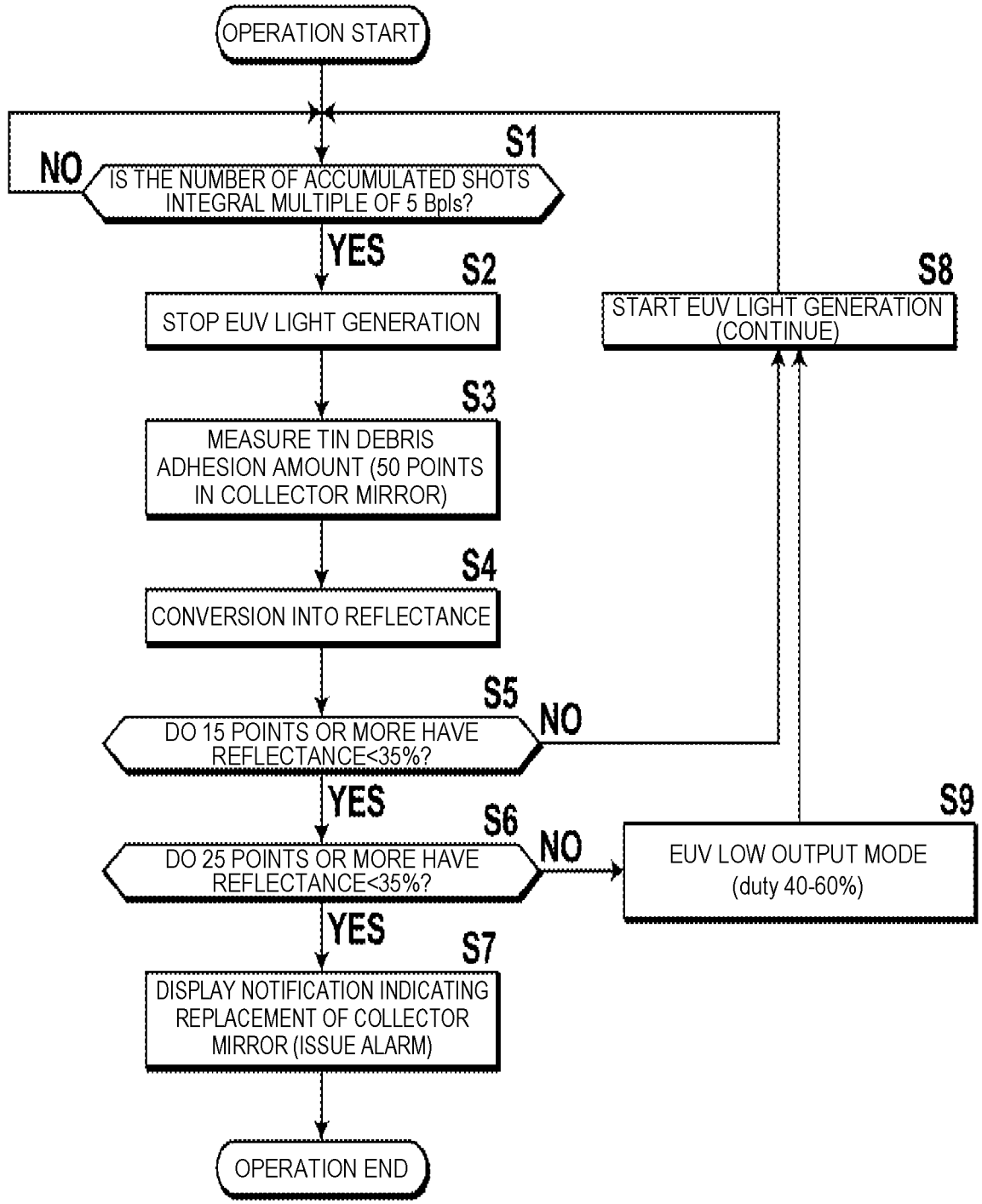
FIG. 6 is a flowchart illustrating a flow of a film thickness measurement process in the EUV light generating apparatus according to the first embodiment.

FIG. 6 is a flowchart showing the flow of a film thickness measurement process in the EUV light generating apparatus 10. Hereinafter, the film thickness measurement process will be described in detail with reference to FIG. 6. The film thickness measurement process is controlled by the film thickness measurement control unit 31 illustrated in FIG. 2. When drive operation for the film thickness measurement process has started, at step S1, the film thickness measurement control unit 31 first determines whether or not the number of accumulated shots of the droplets 2 reaches an integral multiple of 5 Bpls, that is, five billion pulses. The information representing the number of accumulated shots is transmitted from the EUV light generation control unit 33 illustrated in FIG. 2. In the case where the number of accumulated shots of the droplets 2 does not reach an integral multiple of 5 Bpls, the process of step S1 and after is repeated.

When the number of accumulated shots of the droplets 2 reaches an integral multiple of 5 Bpls, at step S2, the film thickness measurement control unit 31 stops generation of the EUV light 4. That is, the film thickness measurement control unit 31 transmits an instruction to stop generation of the EUV light 4 to the EUV light generation control unit 33 to thereby temporarily stop supply of the droplets 2 by the droplet supply device 9 and supply of the pulse laser beam 1 from the laser apparatus 200.

When generation of the EUV light 4 is stopped, for a plurality of points on the surface 11S of the EUV light collector mirror 11, the film thickness measurement control unit 31 measures the adhesion amount of the tin debris by the fluorescent X-ray unit 25 at step S3. More specifically, the measurement is measurement of the film thickness of the tin debris adhering to the surface 11S. Measurement of the film thickness is performed as described above. Also, at the time of measurement of the film thickness, an intensity detection signal output by the fluorescent X-ray detector 28 illustrated in FIG. 3, that is, a signal indicating the film thickness of the tin debris, is input to the film thickness measurement control unit 31.

In the present embodiment, the number of points at which thickness measurement of the tin debris is performed is fifty, for example. The fifty points on the surface 11S of the EUV light collector mirror 11 are previously defined by the X directional coordinate, the Y directional coordinate, and the Z directional coordinate. The film thickness measurement control unit 31 controls driving of the robot hand drive unit 21 such that the fluorescent X-ray unit 25 moving along the surface 11S of the robot hand 24 moves to sequentially approach the fifty points in a confronting manner. Each time the fluorescent X-ray unit 25 approaches each of the fifth points 50 in a confronting manner, the film thickness measurement control unit 31 allows the primary X-ray to be emitted from the primary X-ray tube 26 and allows the fluorescent X-ray detector 28 to detect the intensity of the fluorescent X-ray. Thereby, when there is tin debris adhering to the surface 11S of the EUV light collector mirror 11, the film thickness thereof is measured. Note that the unit of film thickness to be measured is nanometer (nm), for example. The film thickness measurement control unit 31 stores the measured film thickness in a storage unit such as a memory not illustrated, in association with each of the points, that is, each of the fifty points.

Next, at step S4, the film thickness measurement control unit 31 converts the film thickness of the tin debris that is measured for each of the fifty measurement points and stored, into reflectance of the surface 11S of the EUV light collector mirror 11. The film thickness measurement control unit 31 stores, in the storage unit, a correspondence relationship between the film thickness of tin debris and the reflectance previously obtained on the basis of experiments or experiences, in the form of a table. Then, the film thickness measurement control unit 31 performs the conversion on the basis of the stored correspondence relationship. The reflectance of the surface 11S decreases as the film thickness of tin debris is larger. If the reflectance decreases excessively, the function of the EUV light collector mirror 11 deteriorates from the original function. Accordingly, when the reflectance significantly decreases to a predetermined level, it is necessary to replace the EUV light collector mirror 11 with one having the original function. Meanwhile, even when the reflectance of the surface 11S decreases, if the decreasing level is not significant, it is possible to continue operation of the EUV light generating apparatus 10 for the time being while lowering the power of the EUV light 4 so that adhesion of the tin debris can be suppressed.

Next, at step S5, the film thickness measurement control unit 31 next determines whether or not there are fifteen points or more film thickness measurement points at which the reflectance of the surface 11S is less than 35%. When the film thickness measurement control unit 31 determines that there are not fifteen points or more film thickness measurement points at which the reflectance is less than 35%, at step S8, the film thickness measurement control unit 31 allows generation of the EUV light 4 that has been temporarily stopped. Then, the process of step S1 and after is repeated.

On the other hand, when the film thickness measurement control unit 31 determines that there are fifteen points or more film thickness measurement points at which the reflectance of the surface 11S is less than 35%, the film thickness measurement control unit 31 then determines whether or not there are twenty five or more film thickness measurement points at which the reflectance of the surface 11S is less than 35%, at step S6. When the film thickness measurement control unit 31 determines that there are twenty five or more film thickness measurement points at which the reflectance is 35% or less, at step S7, the film thickness measurement control unit 31 displays a notification indicating that replacement of the EUV light collector mirror 11 is required on the monitor 32 illustrated in FIG. 2, for example. This notification is issued as a form of alarm by the words such as "Replacement of collector mirror is required", as an example. Alternatively, when the film thickness measurement control unit 31 is configured of a PC as described above, the alarm may be issued by the sound. With such a notification, the user of the EUV light generating apparatus 10 can know that replacement of the EUV light collector mirror 11 is required.

On the other hand, at step S6, when there are not twenty five or more film thickness measurement points at which the reflectance is less than 35%, the film thickness measurement control unit 31 then sets the EUV light generating apparatus 10 to a low power mode at step S9. That is, the film thickness measurement control unit 31 transmits an instruction to set the mode to the low power mode, to the EUV light generation control unit 33 illustrated in FIG. 2. Thereby, the EUV light generating apparatus 10 is set to the low power mode by the EUV light generation control unit 33. Specifically, assuming that duty is 100% when all of the droplets 2 illustrated in FIG. 1 are irradiated with the pulse laser beam 1, the power of the EUV light 4 is decreased when the duty is set to 40% to 60%, for example. The decrease of the duty is performed by lowering the repetition frequency of the pulse laser beam 1, for example.

By lowering the power of the EUV light 4, it is possible to continue operation of the EUV light generating apparatus 10 for the time being while suppressing adhesion of the tin debris to the surface 11S. Note that in the case of an exposure device in which the EUV light 4 is used as exposure light, by setting the exposure time longer, for example, it is possible to compensate for the decrease of the power of the EUV light 4 to thereby secure the necessary exposure amount.

After the EUV light generating apparatus 10 is set to the low power mode, the process flow goes through step S8 and then returns to step S1, and the process of step S1 and after is repeated. If a notification indicating that replacement of the EUV light collector mirror 11 is required is made at step S7, drive operation for the film thickness measurement process ends.

As is obvious from the above description, the film thickness of the tin debris on the surface 11S corresponding to the reflectance of 35% corresponds to a threshold of the film thickness according to the present disclosure. The fifteen points and the twenty five points that are numbers of the film thickness measurement points correspond to a second region and a first region according to the present disclosure, respectively. Assuming that A represents the total number of film thickness measurement points, B represents the number of film thickness measurement points as the first region, and C represents the number of film thickness measurement points as the second region, a relationship of A>B≥C is established. In the present embodiment, A=50, B=25, and C=15 are satisfied. However, the number of points is not limited thereto. Any number may be used. Also, the film thickness measurement control unit 31 constitutes a control unit according to the present disclosure, and the film thickness measurement control unit 31 and the monitor 32 constitutes a notification unit according to the present disclosure.

Note that the determination process at step S1 may be replaced with a process of determining whether or not the accumulated generation time of the EUV light 4 reaches an integral multiple of twenty four hours, or whether or not the accumulated energy amount of the generated EUV light 4 reaches an integral multiple of 1 kilojoules (kJ).

Further, the film thicknesses of the tin debris measured at a plurality of measurement points may be displayed on the monitor 32 in association with the coordinates of the respective measurement points. This display is made by displaying specific measurement values in which the unit is nm, for example. Alternatively, the film thickness measurement results may be displayed in the form of so-called color map in which dots or the like of colors that are different by the range of measurement values are displayed on a display region likened to the surface 11S on which the film thickness measurement has been performed. By referring to such a display, the user of the EUV light generating apparatus 10 can easily determine where or not it is necessary to replace the EUV light collector mirror 11 or set the EUV light generating apparatus 10 to the low power mode.

3.3 Effect

As described above, according to the EUV light generating apparatus 10 of the present embodiment, it is possible to easily measure the film thickness of the tin debris adhering to the surface 11S of the EUV light collector mirror 11 without need of large-scale operation of removing the EUV light collector mirror 11. Further, according to the EUV light generating apparatus 10 of the present embodiment, it is possible to accurately know that it is time to replace the EUV light collector mirror 11.

4. Second Embodiment

Next, with reference to FIGS. 7 and 8, an EUV light generating apparatus 20 according to a second embodiment will be described. The EUV light generating apparatus 20 also has a function of measuring the film thickness of the debris adhering to the surface of a component in the chamber 5 without need of removing the component. Regarding the configurations and operations of the EUV light generating apparatus 20 of the second embodiment, description is omitted for the configurations and operations that are the same as those of the EUV light generating apparatus 100 of the comparative example illustrated in FIG. 1 and those of the EUV light generating apparatus 10 of the first embodiment illustrated in FIGS. 2 to 6.

4.1 Configuration

Figure 7:
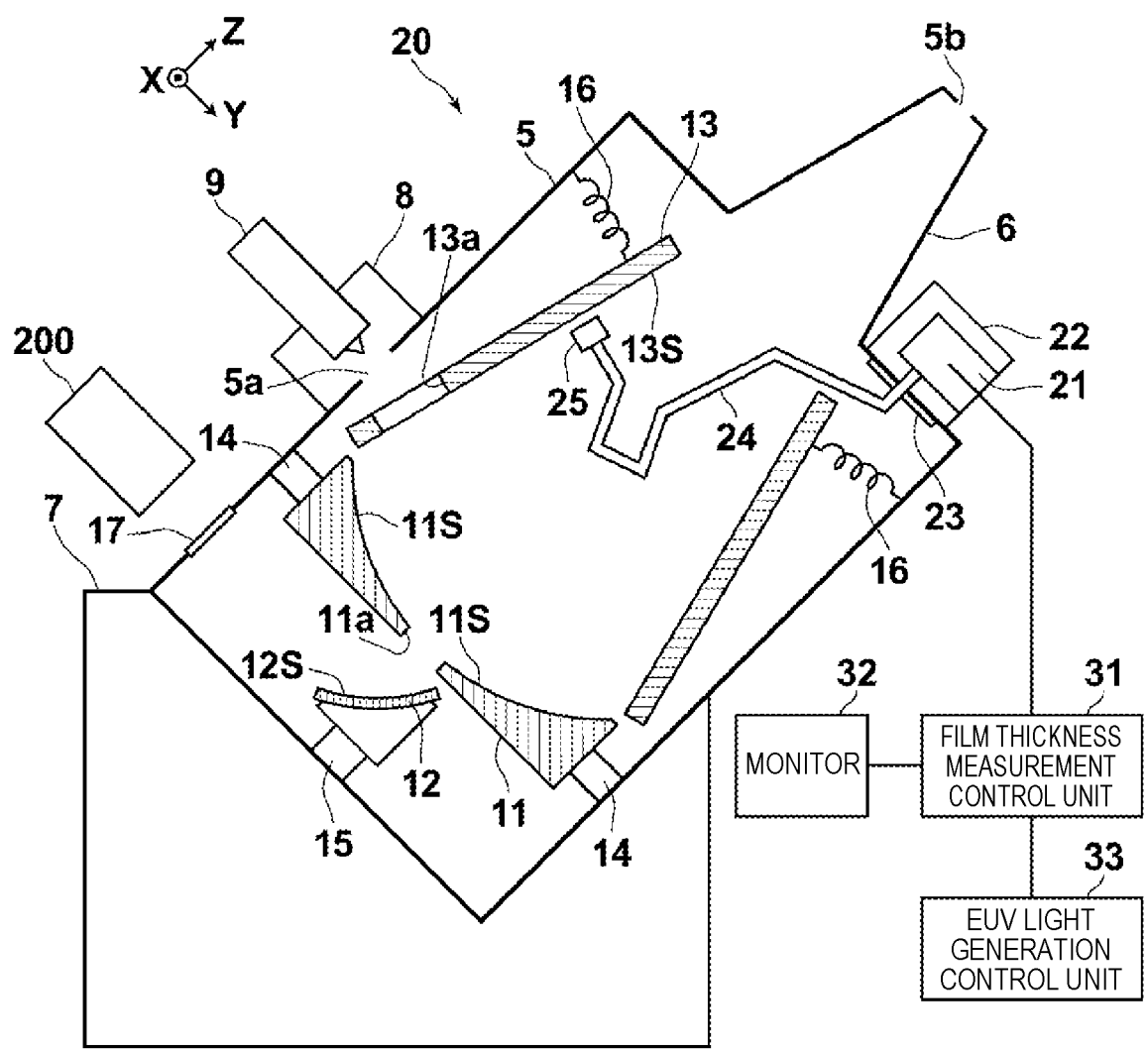
FIG. 7 is a diagram schematically illustrating a configuration of an EUV light generating apparatus according to a second embodiment.

FIG. 7 schematically illustrates a configuration of the EUV light generating apparatus 20 according to the second embodiment. As compared with the EUV light generating apparatus 10 of the first embodiment, the EUV light generating apparatus 20 is basically different in that the fluorescent X-ray unit 25 moves along a surface 13S of the heat shield 13 and is able to measure the film thickness of the tin debris adhering to the surface 13S. Further, the EUV light generating apparatus 20 of the present embodiment differs from the EUV light generating apparatus 10 of the first embodiment in that the film thickness measurement control unit 31 illustrated in FIG. 7 is configured to perform a process different from that of the first embodiment.

Further, as the fluorescent X-ray unit of the present embodiment, the fluorescent X-ray unit 25 illustrated in FIG. 5 and referred to in the description of the first embodiment is used. In the fluorescent X-ray unit 25 illustrated in FIG. 5, the measurement surface 25f is flat in order to measure the film thickness of the tin debris on the surface 13S of the flat heat shield 13. Note that a heat shield is described in detail in Patent Document 3, for example.

4.2 Operation

The fluorescent X-ray unit 25 moves along the surface 13S of the heat shield 13 by the robot hand 24. Each time the fluorescent X-ray unit 25 moving as described above becomes a state where it approaches each of the points on the surface 13S in a confronting manner, measurement of the film thickness of the tin debris on the surface 13S is performed. The measurement of a film thickness is performed in the same manner as that of the first embodiment.

Figure 8:
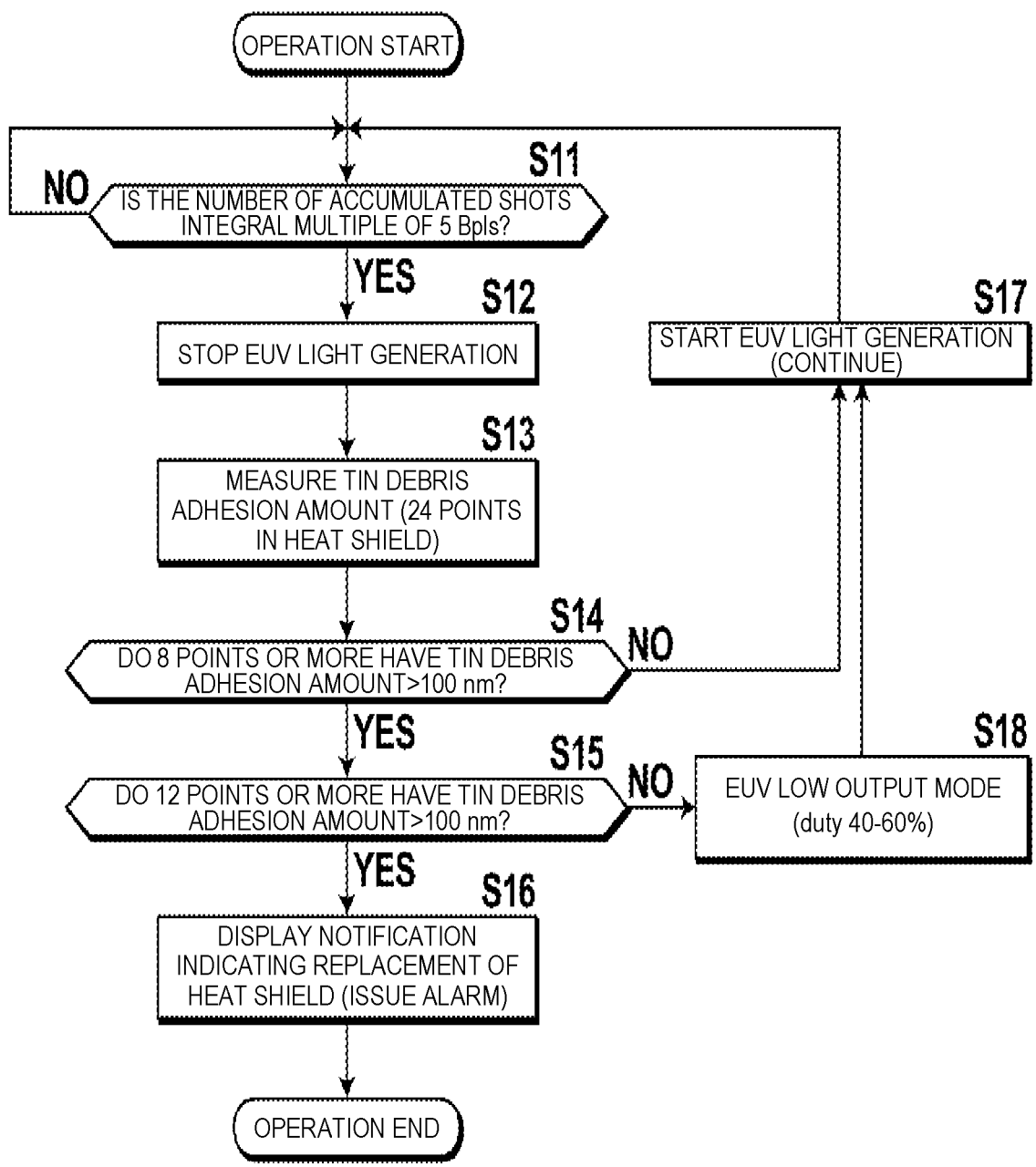
FIG. 8 is a flowchart illustrating a flow of a film thickness measurement process in the EUV light generating apparatus according to the second embodiment.

FIG. 8 is a flowchart showing the flow of a film thickness measurement process in the EUV light generating apparatus 20. Hereinafter, the film thickness measurement process will be described in detail with reference to FIG. 8. The film thickness measurement process is controlled by the film thickness measurement control unit 31 illustrated in FIG. 7. When drive operation for the film thickness measurement process has started, at step S11, the film thickness measurement control unit 31 first determines whether or not the number of accumulated shots of the droplets 2 reaches an integral multiple of 5 Bpls, that is, five billion pulses. The information representing the number of accumulated shots is transmitted from the EUV light generation control unit 33 illustrated in FIG. 7. In the case where the number of accumulated shots of the droplets 2 does not reach an integral multiple of 5 Bpls, the process of step S11 and after is repeated.

When the number of accumulated shots of the droplets 2 reaches an integral multiple of 5 Bpls, at step S12, the film thickness measurement control unit 31 stops generation of the EUV light 4. That is, the film thickness measurement control unit 31 transmits an instruction to stop generation of the EUV light 4 to the EUV light generation control unit 33 to thereby temporarily stop supply of the droplets 2 by the droplet supply device 9 and supply of the pulse laser beam 1 from the laser apparatus 200.

When generation of the EUV light 4 is stopped, for a plurality of points on the surface 13S of the heat shield 13, the film thickness measurement control unit 31 measures the adhesion amount of the tin debris by the fluorescent X-ray unit 25 at step S13. More specifically, the measurement is measurement of the film thickness of the tin debris adhering to the surface 13S. Measurement of the film thickness is performed as described above. Also, at the time of measurement of the film thickness, an intensity detection signal output by the fluorescent X-ray detector 28 illustrated in FIG. 5, that is, a signal indicating the film thickness of the tin debris, is input to the film thickness measurement control unit 31 illustrated in FIG. 7.

In the present embodiment, the number of points at which measurement of the film thickness of the tin debris is performed is twenty four, for example. The twenty four points on the surface 13S of the heat shield 13 are previously defined by the X directional coordinate, the Y directional coordinate, and the Z directional coordinate. The film thickness measurement control unit 31 controls driving of the robot hand drive unit 21 such that the fluorescent X-ray unit 25 moving along the surface 13S by the robot hand 24 moves to sequentially approach the twenty four points in a confronting manner. Each time the fluorescent X-ray unit 25 approaches each of the twenty four points in a confronting manner, the film thickness measurement control unit 31 allows the primary X-ray to be emitted from the primary X-ray tube 26 and allows the fluorescent X-ray detector 28 to detect the intensity of the fluorescent X-ray. Thereby, when there is tin debris adhering to the surface 13S of the heat shield 13, the film thickness thereof is measured. The film thickness measurement control unit 31 stores the measured film thickness in a storage unit such as a memory not illustrated, in association with each of the points, that is, each of the twenty four measurement points.

Next, at step S14, the film thickness measurement control unit 31 determines whether or not there are eight or more film thickness measurement points, among the twenty four measurement points, at which the film thickness of the tin debris that is measured and stored exceeds 100 nm. When the film thickness measurement control unit 31 determines that there are not eight or more film thickness measurement points at which the measured film thickness exceeds 100 nm, at step S17, the film thickness measurement control unit 31 allows generation of the EUV light 4 that has been temporarily stopped. Then, the process of step S11 and after is repeated.

On the other hand, when the film thickness measurement control unit 31 determines that there are eight or more film thickness measurement points at which the measured film thickness exceeds 100 nm, the film thickness measurement control unit 31 then determines whether or not there are twelve or more film thickness measurement points at which the measured film thickness exceeds 100 nm at step S15. When the film thickness measurement control unit 31 determines that there are twelve or more film thickness measurement points at which the measured film thickness exceeds 100 nm, at step S16, the film thickness measurement control unit 31 displays a notification indicating that replacement of the heat shield 13 is required on the monitor 32 illustrated in FIG. 7, for example. This notification is issued as a form of alarm by the words such as "Replacement of heat shield is required", for example. Alternatively, when the film thickness measurement control unit 31 is configured of a PC as described above, the alarm may be issued by the sound. With such a notification, the user of the EUV light generating apparatus 20 can know that replacement of the heat shield 13 is required.

On the other hand, when the film thickness measurement control unit 31 determines that there are not twelve or more film thickness measurement points at which the measured film thickness exceeds 100 nm, the film thickness measurement control unit 31 then sets the EUV light generating apparatus 20 to the low power mode at step S18. The setting of the low power mode is performed in the same manner as that of the first embodiment.

By lowering the power of the EUV light 4, it is possible to continue operation of the EUV light generating apparatus 20 for the time being while suppressing adhesion of tin debris to the surface 13S. Note that in the case of an exposure device in which the EUV light 4 is used as exposure light, by setting the exposure time longer, for example, it is possible to compensate for the decrease of the power of the EUV light 4 to thereby secure the necessary exposure amount.

After the EUV light generating apparatus 20 is set to the low power mode, the process flow goes through step S17 and then returns to step S11, and the process of step S11 and after is repeated. If a notification indicating that replacement of the heat shield 13 is required is made at step S16, drive operation for the film thickness measurement process ends.

As is obvious from the above description, the measured film thickness of 100 nm of the tin debris corresponds to a threshold of the film thickness according to the present disclosure. The eight points and the twelve points that are the numbers of the film thickness measurement points correspond to the second region and the first region of the present disclosure, respectively. Also, the film thickness measurement control unit 31 constitutes a control unit according to the present disclosure, and the film thickness measurement control unit 31 and the monitor 32 constitutes a notification unit according to the present disclosure.

Note that the determination process at step S11 may be replaced with a process of determining whether or not the accumulated generation time of the EUV light 4 reaches an integral multiple of twenty four hours, or whether or not the accumulated energy amount of the generated EUV light 4 reaches an integral multiple of 1 kilojoules (kJ).

Further, the film thicknesses of the tin debris measured at a plurality of measurement points may be displayed on the monitor 32 in association with the coordinates of the respective measurement points. Such a display is made in the same manner as that of the first embodiment. By referring to such a display, the user of the EUV light generating apparatus 20 can easily determine whether or not it is necessary to replace the heat shield 13 or set the EUV light generating apparatus 20 to the low power mode.

4.3 Effect

As described above, according to the EUV light generating apparatus 20 of the present embodiment, it is possible to easily measure the film thickness of the tin debris adhering to the surface 13S of the heat shield 13 without need of large-scale operation of removing the heat shield 13. Further, according to the EUV light generating apparatus 20 of the present embodiment, it is possible to accurately know that it is time to replace the heat shield 13.

5. Third Embodiment

Figure 9:
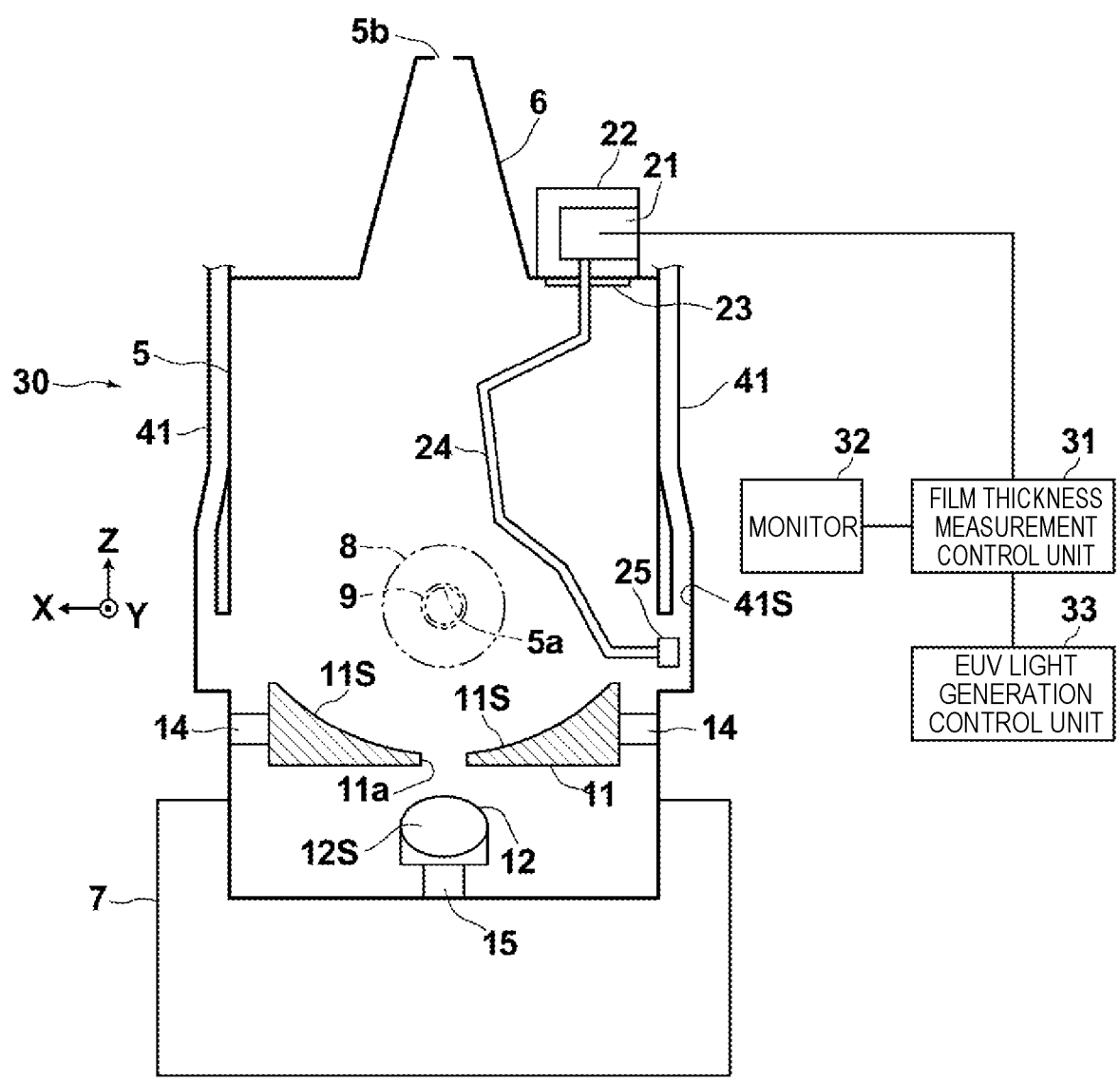
FIG. 9 is a diagram schematically illustrating a configuration of an EUV light generating apparatus according to a third embodiment.

Next, with reference to FIG. 9, an EUV light generating apparatus 30 according to a third embodiment will be described. Note that FIG. 9 illustrates a state where the EUV light generating apparatus 30 is seen from a direction turned by 90° around the Z axis as compared with FIGS. 2 and 7. In the EUV light generating apparatus 30, hydrogen is introduced in the chamber 5. Therefore, the EUV light generating apparatus 30 includes an exhaust path 41 for discharging hydrogen and stannane gas from the inside of the chamber 5, and has a function of measuring the film thickness of the debris adhering to the inner surface of the exhaust path 41 without removing the exhaust path 41. Regarding the configurations and operations of the EUV light generating apparatus 30 of the third embodiment, description is omitted for the configurations and operations that are the same as those of the EUV light generating apparatus 10 of the first embodiment and the EUV light generating apparatus 20 of the second embodiment.

5.1 Configuration

FIG. 9 schematically illustrates a configuration of the EUV light generating apparatus 30 according to the third embodiment. As compared with the EUV light generating apparatus 20 of the second embodiment, the EUV light generating apparatus 30 is basically different in that the fluorescent X-ray unit 25 moves along an inner surface 41S of the exhaust path 41 and is able to measure the film thickness of the tin debris adhering to the inner surface 41S.

Note that an exhaust path provided to an EUV light generating apparatus is described in detail in Patent Document 4, for example.

5.2 Operation

The fluorescent X-ray unit 25 moves along the inner surface 41S of the exhaust path 41 by the robot hand 24. As the inner surface 41S of the exhaust path 41, the inner surface of a portion against which the exhaust from the chamber 5 collides, that is, a portion where tin debris is likely to adhere, is selected. Each time the fluorescent X-ray unit 25 moving as described above becomes a state where it approaches each of the points on the inner surface 41S in a confronting manner, measurement of the film thickness of the tin debris on the inner surface 41S is performed. The measurement of the film thickness is performed in the same manner as that of the first embodiment and the second embodiment.

The film thickness measurement process in the EUV light generating apparatus 30 is performed in the same manner as the process shown in the flowchart of FIG. 8, for example.

5.3 Effect

According to the EUV light generating apparatus 30 of the present embodiment, it is possible to easily measure the film thickness of the tin debris adhering to the inner surface 41S of the exhaust path 41 without need of large-scale operation of removing the exhaust path 41. Further, according to the EUV light generating apparatus 30 of the present embodiment, it is possible to accurately know that it is time to replace the exhaust path 41.

6. Fourth Embodiment

Next, with reference to FIG. 10, an EUV light generating apparatus 40 according to a fourth embodiment will be described. The EUV light generating apparatus 40 has a function of measuring the film thickness of the debris adhering to a surface 12S of the laser beam condensing mirror 12 without need of removing the laser beam condensing mirror 12. Regarding the configurations and operations of the EUV light generating apparatus 40 of the fourth embodiment, description is omitted for the configurations and operations that are the same as those of the EUV light generating apparatus 10 of the first embodiment and the EUV light generating apparatus 20 of the second embodiment.

6.1 Configuration

Figure 10:
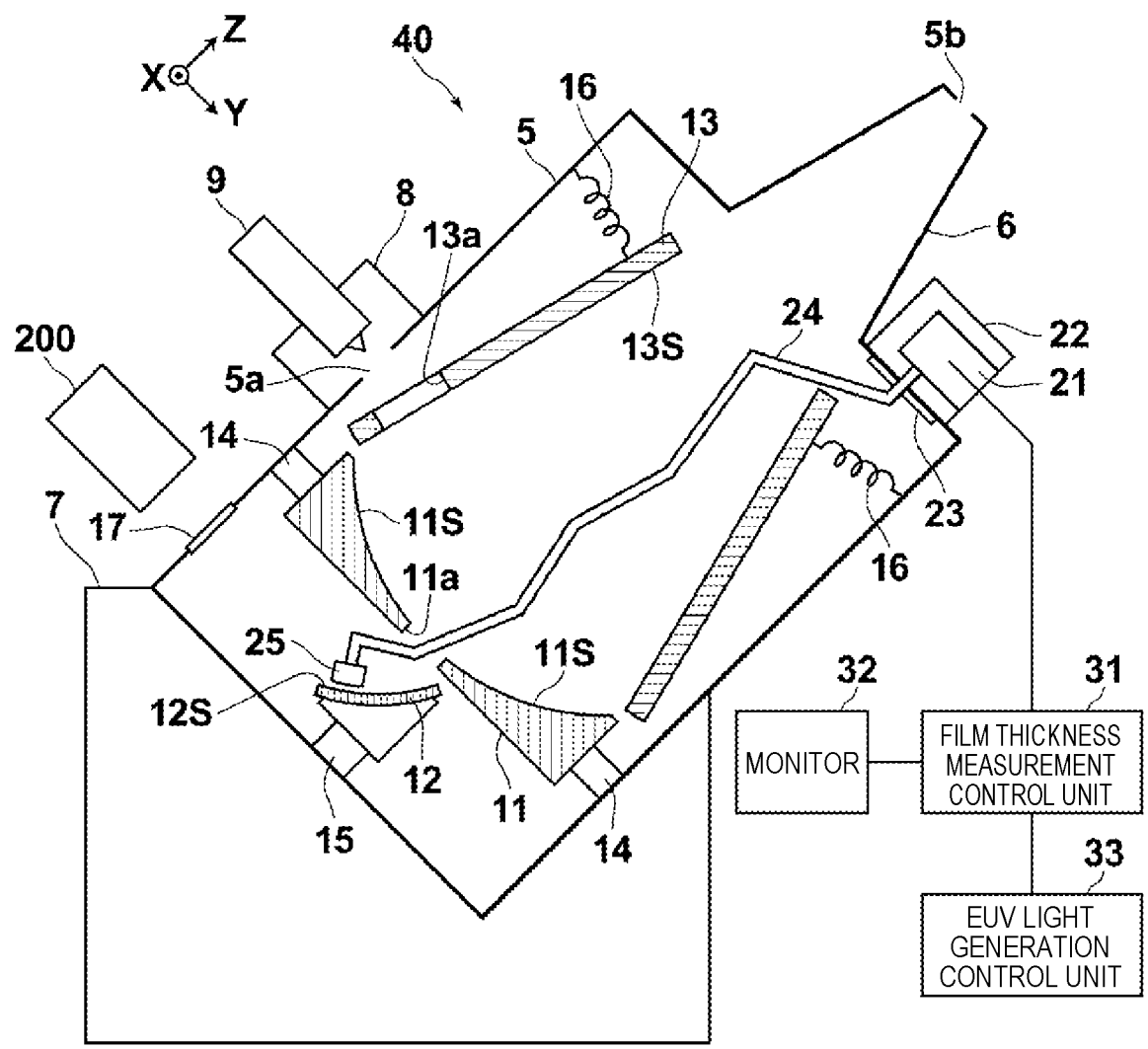
FIG. 10 is a diagram schematically illustrating a configuration of an EUV light generating apparatus according to a fourth embodiment.

FIG. 10 schematically illustrates a configuration of the EUV light generating apparatus 40 according to the fourth embodiment. As compared with the EUV light generating apparatus 10 of the first embodiment, the EUV light generating apparatus 40 is basically different in that the fluorescent X-ray unit 25 moves along the surface 12S of the laser beam condensing mirror 12 and is able to measure the film thickness of the tin debris adhering to the surface 12S.

6.2 Operation

The fluorescent X-ray unit 25 moves along the surface 12S of the laser beam condensing mirror 12 by the robot hand 24. Each time the fluorescent X-ray unit 25 moving as described above becomes a state where it approaches each of the points on the surface 12S in a confronting manner, measurement of the film thickness of the tin debris on the surface 12S is performed. The measurement of the film thickness is performed in the same manner as that of the first embodiment and the second embodiment.

The film thickness measurement process in the EUV light generating apparatus 40 is performed in the same manner as the process shown in the flowchart of FIG. 6, for example.

6.3 Effect

According to the EUV light generating apparatus 40 of the present embodiment, it is possible to easily measure the film thickness of the tin debris adhering to the surface 12S of the laser beam condensing mirror 12 without need of large-scale operation of removing the laser beam condensing mirror 12. Further, according to the EUV light generating apparatus 40 of the present embodiment, it is possible to accurately know that it is time to replace the laser beam condensing mirror 12.

7. Fifth Embodiment

Next, with reference to FIG. 11, an EUV light generating apparatus 50 according to a fifth embodiment will be described. The EUV light generating apparatus 50 has a function of measuring the film thickness of the debris adhering to a surface 51S of a damper mirror 51 without need of removing the damper mirror 51. Regarding the configurations and operations of the EUV light generating apparatus 50 of the fifth embodiment, description is omitted for the configurations and operations that are the same as those of the EUV light generating apparatus 10 of the first embodiment and the EUV light generating apparatus 20 of the second embodiment.

7.1 Configuration

Figure 11:
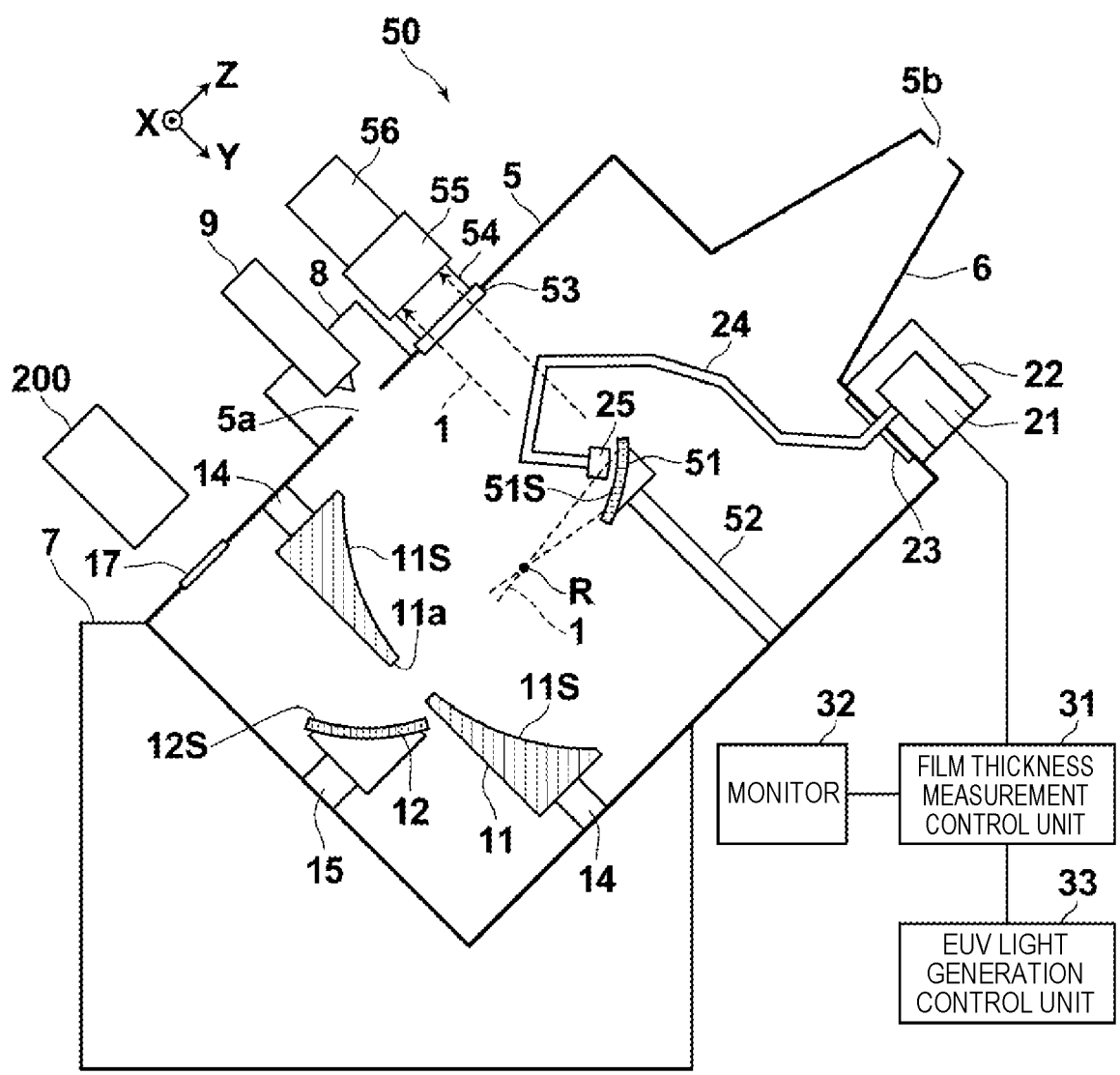
FIG. 11 is a diagram schematically illustrating a configuration of an EUV light generating apparatus according to a fifth embodiment.

FIG. 11 schematically illustrates a configuration of the EUV light generating apparatus 50 according to the fifth embodiment. As compared with the EUV light generating apparatus 10 of the first embodiment, the EUV light generating apparatus 50 is basically different in that the fluorescent X-ray unit 25 moves along a surface 51S of the damper mirror 51 and is able to measure the film thickness of the tin debris adhering to the surface 51S. Further, the EUV light generating apparatus 50 also includes a holding member 52 that holds the damper mirror 51 inside the chamber 5, a window 53 attached to the chamber 5, a connecting section 54, a beam dump device 55, and a cooling device 56.

7.2 Operation

The damper mirror 51 condenses the pulse laser beam 1 that has traveled toward the droplet 2 and passed through the plasma generating region R without being radiated to the droplet 2. At the time of measuring the film thickness of the tin debris, supply of the pulse laser beam 1 toward the droplet 2 is stopped. However, in FIG. 11, the optical path of the pulse laser beam 1 at the time of EUV light generation is indicated by a broken line. The pulse laser beam 1 condensed by the damper mirror 51 passes through the window 53 and enters the beam dump device 55 via the connecting section 54, and is absorbed by the beam dump device 55. The beam dump device 55 is cooled by the cooling device 56, whereby a temperature rise due to absorbing of the pulse laser beam 1 is suppressed. Note that the damper mirror is described in detail in Patent Document 5, for example.

The fluorescent X-ray unit 25 moves along the surface 51S of the damper mirror 51 by the robot hand 24. Each time the fluorescent X-ray unit 25 moving as described above becomes a state where it approaches each of the points on the surface 51S in a confronting manner, measurement of the film thickness of the tin debris on the surface 51S is performed. The measurement of the film thickness is performed in the same manner as that of the first embodiment and the second embodiment.

The film thickness measurement process in the EUV light generating apparatus 50 is performed in the same manner as the process shown in the flowchart of FIG. 6, for example.

7.3 Effect

According to the EUV light generating apparatus 50 of the present embodiment, it is possible to easily measure the film thickness of the tin debris adhering to the surface 51S of the damper mirror 51 without need of large-scale operation of removing the damper mirror 51. Further, according to the EUV light generating apparatus 50 of the present embodiment, it is possible to accurately know that it is time to replace the damper mirror 51.

8. Others

It may be obvious to those skilled in the art that in the embodiments described above, respective techniques are applicable to one another among the embodiments including the comparative example.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more."

What is claimed is:

1. An extreme ultraviolet light generating apparatus comprising:
    a chamber in which a target material is irradiated with a laser beam and extreme ultraviolet light is generated;
    an optical element disposed in the chamber; and
    a measurement device movable along a surface of the optical element and configured to measure a film thickness of the target material adhering to the surface of the optical element, wherein
    the measurement device includes a fluorescent X-ray unit configured to measure the film thickness by fluorescent X-ray analysis.

2. An extreme ultraviolet light generating apparatus comprising:
    a chamber in which a target material is irradiated with a laser beam and extreme ultraviolet light is generated;
    an optical element disposed in the chamber; and
    a measurement device movable along a surface of the optical element and configured to measure a film thickness of the target material adhering to the surface of the optical element, wherein
    the measurement device includes a polyarticular robot configured to move a unit that measures the film thickness along the surface of the optical element.

3. An extreme ultraviolet light generating apparatus comprising:
    a chamber in which a target material is irradiated with a laser beam and extreme ultraviolet light is generated;
    an exhaust path through which exhaust from inside of the chamber flows; and
    a measurement device movable along an inner surface of the exhaust path and configured to measure a film thickness of the target material adhering to the inner surface of the exhaust path.

4. The extreme ultraviolet light generating apparatus according to claim 3, wherein
    the measurement device includes a fluorescent X-ray unit configured to measure the film thickness by fluorescent X-ray analysis.

5. The extreme ultraviolet light generating apparatus according to claim 3, wherein
    the measurement device includes a polyarticular robot configured to move a unit that measures the film thickness along the inner surface of the exhaust path.

* * * * *